United States Patent
Baur et al.

(10) Patent No.: US 10,276,752 B2
(45) Date of Patent: Apr. 30, 2019

(54) OPTOELECTRONIC SEMICONDUCTOR COMPONENT AND METHOD OF PRODUCING AN OPTOELECTRONIC SEMICONDUCTOR COMPONENT

(71) Applicant: OSRAM Opto Semiconductors GmbH, Regensburg (DE)

(72) Inventors: Johannes Baur, Regensburg (DE); Jürgen Moosburger, Lappersdorf (DE); Lutz Höppel, Alteglofsheim (DE); Markus Maute, Alteglofsheim (DE); Thomas Schwarz, Regensburg (DE); Matthias Sabathil, Regensburg (DE); Ralph Wirth, Lappersdorf (DE); Alexander Linkov, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/745,240

(22) PCT Filed: Jul. 11, 2016

(86) PCT No.: PCT/EP2016/066418
§ 371 (c)(1),
(2) Date: Jan. 16, 2018

(87) PCT Pub. No.: WO2017/009281
PCT Pub. Date: Jan. 19, 2017

(65) Prior Publication Data
US 2019/0006562 A1    Jan. 3, 2019

(30) Foreign Application Priority Data

Jul. 16, 2015 (DE) ........................ 10 2015 111 573

(51) Int. Cl.
*H01L 33/36* (2010.01)
*H01L 33/38* (2010.01)
(Continued)

(52) U.S. Cl.
CPC ............ *H01L 33/42* (2013.01); *H01L 33/387* (2013.01); *H01L 33/58* (2013.01); *H01L 33/36* (2013.01); *H01L 2933/0016* (2013.01)

(58) Field of Classification Search
None
See application file for complete search history.

(56) References Cited

U.S. PATENT DOCUMENTS

| 2010/0194274 A1 | 8/2010 | Hoogzaad |
| 2011/0140152 A1* | 6/2011 | Song ...................... H01L 33/44 257/98 |

(Continued)

FOREIGN PATENT DOCUMENTS

| CN | 102876281 A | 1/2013 |
| DE | 201 22 323 U1 | 5/2005 |

(Continued)

OTHER PUBLICATIONS

Voisin, Leandro, et al. "Titanium Doped ITO Thin Films Produced by Sputtering Method." Materials Transactions, vol. 51, No. 3, 2010, pp. 503-509., doi:10.2320/matertrans.mbw200907.*

(Continued)

*Primary Examiner* — J. E. Schoenholtz
(74) *Attorney, Agent, or Firm* — DLA Piper LLP (US)

(57) ABSTRACT

An optoelectronic semiconductor component includes a light-emitting semiconductor body having a radiation side, a current expansion layer arranged on the radiation side of the semiconductor body and at least partially covers this side, wherein the current expansion layer includes an electrically-conductive material transparent to the light radiated by the (Continued)

semiconductor body, and particles of a further material, and an electrical contact arranged on a side of the current expansion layer facing away from the semiconductor body.

13 Claims, 2 Drawing Sheets

(51) Int. Cl.
*H01L 33/42* (2010.01)
*H01L 33/58* (2010.01)

(56) References Cited

U.S. PATENT DOCUMENTS

| | | | |
|---|---|---|---|
| 2012/0097922 A1* | 4/2012 | Masuya | H01L 33/42 257/13 |
| 2012/0211788 A1* | 8/2012 | Yuh | H01L 33/145 257/98 |
| 2013/0228818 A1 | 9/2013 | Suzuki | |
| 2014/0167085 A1* | 6/2014 | Lee | H01L 51/5268 257/98 |
| 2014/0252388 A1 | 9/2014 | Kimura et al. | |
| 2014/0306244 A1 | 10/2014 | Oraw et al. | |
| 2014/0306252 A1* | 10/2014 | Chen | H01L 33/58 257/98 |
| 2016/0118546 A1* | 4/2016 | Wuu | H01L 33/44 438/29 |

FOREIGN PATENT DOCUMENTS

| | | |
|---|---|---|
| DE | 10 2008 035 900 A1 | 11/2009 |
| EP | 2 264 792 A2 | 12/2010 |

OTHER PUBLICATIONS

Carreras, Paz, et al. "Transparent Conducting Thin Films by Co-Sputtering of ZnO-ITO Targets." Physica Status Solidi (c), 2010, doi:10.1002/pssc.200982852.*

Notification for the Opinion of Examination dated Jun. 23, 2017, from corresponding Taiwanese Patent Application No. 105122210 in English.

* cited by examiner

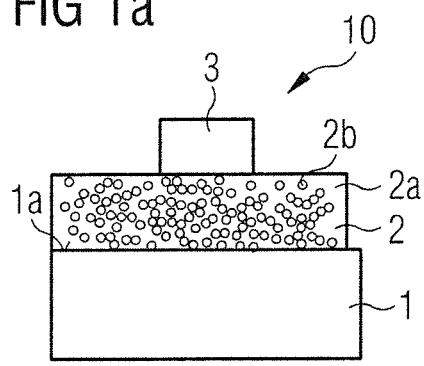
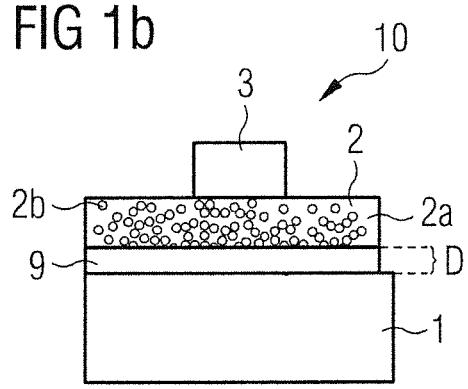
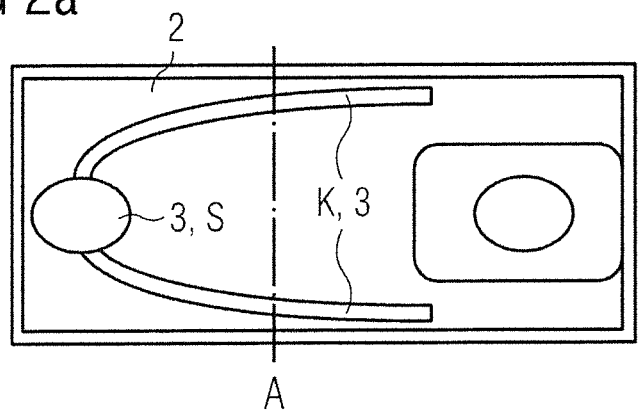
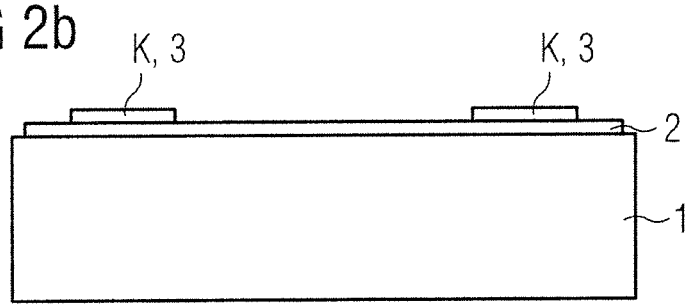

OPTOELECTRONIC SEMICONDUCTOR COMPONENT AND METHOD OF PRODUCING AN OPTOELECTRONIC SEMICONDUCTOR COMPONENT

TECHNICAL FIELD

This disclosure relates to an optoelectronic semiconductor component and to a method of producing an optoelectronic semiconductor component.

BACKGROUND

In surface-emitting semiconductor components with a top-side contacting, emission of light via their top side can be reduced due to contact structures. To impress current into semiconductor layers of a surface-emitting semiconductor component in a planar manner, a layer for current expansion can be arranged on the semiconductor component, this layer being transparent. As a result, expansion of reflecting or at least shading contact structures can be reduced on the radiation side of the semiconductor component. Nevertheless, to efficiently couple the light out of the semiconductor component, conventional transparent current expansion layers have a refractive index which is too low, which is why an excessive proportion of the light remains at the interface between the semiconductor body and the current expansion layer in the semiconductor component due to total reflection.

It could therefore be helpful to provide a semiconductor component with an improved contacting of a semiconductor body on the emitting top side thereof with regard to an improved current impression into the semiconductor body and an improved outcoupling of radiation as well as a method of producing such a contacting.

SUMMARY

We provide an optoelectronic semiconductor component including a light-emitting semiconductor body having a radiation side, a current expansion layer arranged on the radiation side of the semiconductor body and at least partially covers this side, wherein the current expansion layer includes an electrically-conductive material transparent to the light radiated by the semiconductor body, and particles of a further material, and an electrical contact arranged on a side of the current expansion layer facing away from the semiconductor body.

We also provide a method of producing an optoelectronic semiconductor component including providing a light-emitting semiconductor body, producing a current expansion layer by simultaneously applying an electrically-conductive material transparent to light radiated by the semiconductor body, and particles of a further material, on a radiation side of the semiconductor body, wherein the current expansion layer at least partially covers the radiation side of the semiconductor body, and arranging an electrical contact on the current expansion layer.

We further provide an optoelectronic semiconductor component including a light-emitting semiconductor body having a radiation side, a current expansion layer arranged on the radiation side of the semiconductor body and at least partially covers this side, wherein the current expansion layer includes an electrically-conductive material transparent to the light radiated by the semiconductor body, and particles of a further material, and an electrical contact arranged on a side of the current expansion layer facing away from the semiconductor body, wherein the transparent electrically-conductive material and the particles of the further material form a material composite, the refractive index n3 of the particles of the further material is higher than the refractive index n1 of the transparent material, and the particles of the further material include $TiO_2$.

BRIEF DESCRIPTION OF THE DRAWINGS

FIGS. 1a and 1b show an optoelectronic semiconductor component in a schematic side view.

FIGS. 2a, 2b and 2c show an electric contact on a current expansion layer.

LIST OF REFERENCE CHARACTERS

Figure 2C:
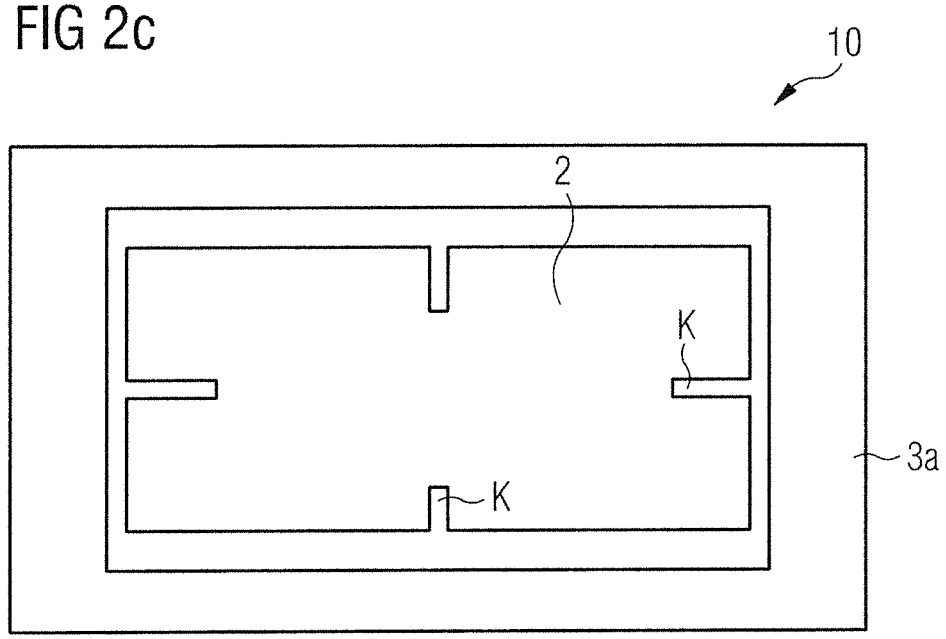

1 Light-emitting semiconductor body
1a Radiation side
2 Current expansion layer
2a Transparent conductive material
2b Particles
2c Side of the current expansion layer facing away from the semiconductor body
3 Electrical contact
3a Frame region
9 Further layer made of transparent conductive material
D Thickness of the further layer
10 Optoelectronic semiconductor component
K Contact web
S Terminal

DETAILED DESCRIPTION

Our optoelectronic semiconductor component includes a light-emitting semiconductor body having a radiation side, a current expansion layer arranged on the radiation side of the semiconductor body and at least partially covers this side, wherein the current expansion layer includes an electrically-conductive material transparent to the light radiated by the semiconductor body, and particles of a further material, as well as an electric contact arranged on a side of the current expansion layer facing away from the semiconductor body.

Advantageously, the light-emitting semiconductor body can be formed as a surface-emitting semiconductor chip. Advantageously, the semiconductor body is contacted from the radiation side, wherein a most homogenous current distribution over the radiation side and a current impression into the semiconductor body is achieved by the current expansion layer. To ensure a radiation as well as a contacting of the semiconductor body through the current expansion layer, this layer includes a transparent and electrically-conductive material, e.g., ITO or zinc oxide.

Advantageously, the current expansion layer covers the semiconductor body on the radiation side at least in places. Furthermore, it is possible for the current expansion layer to partially or completely cover the region of an active zone of the semiconductor body, in which light is generated during operation of the semiconductor component. Advantageously, it is also possible for the current expansion layer to completely cover the radiation side.

A current is fed into the current expansion layer through an electrical contact on the current expansion layer, wherein the electrical contact advantageously does not completely cover the current expansion layer. A surface coverage of the electrical contact on the current expansion layer is advantageously much lower than a surface coverage of the current expansion layer on the semiconductor body. A shading effect, due to the electrical contact, for light coupled out of the current expansion layer is reduced thereby.

Advantageously, the particles of the further material are distributed within the current expansion layer as homogenously as possible. Optical properties as well as the electrical conductivity of the current expansion layer can advantageously be influenced by the particles. The transparent electrically-conductive material and the particles of the further material advantageously form a material composite forming the current expansion layer.

The particles of the further material may have a refractive index $n3$, which is different from a refractive index $n1$ of the transparent material.

The optical properties of the current expansion layer are influenced by the refractive index of the materials comprised by the current expansion layer. Advantageously, the particles can be distributed homogenously within the transparent material of the current expansion layer, resulting in a homogenous change of an average refractive index $n2$ of the current expansion layer. The average refractive index $n2$ of the current expansion layer is between the refractive indices of the transparent material $n1$ and of the particles $n3$. As a result, the average refractive index $n2$ changes depending on the content of the materials having the refractive indices $n1$ and $n3$.

The refractive index $n3$ of the particles of the further material may be higher than the refractive index $n1$ of the transparent material.

A refractive index $n3$ of the particles, which is higher than the refractive index $n1$ of the transparent material, causes the average refractive index $n2$ to increase depending on the content of the particles in the current expansion layer compared to the value of $n1$. In this way, the particles alter the transmission properties of the current expansion layer for light. An altered average refractive index $n2$ changes the angular condition for total reflection of light at the interface of the current expansion layer and the semiconductor body, and the outcoupling efficiency out of the semiconductor body, on which the current expansion layer is arranged, is higher.

The particles of the further material may include $TiO_2$.

The particles including $TiO_2$ particles allow an increase in the average refractive index $n2$ and are advantageously suitable to form the current expansion layer as a material composite together with the transparent material. Advantageously, electric resistance of the current expansion layer can be minimized and, simultaneously, outcoupling of light can be maximized by introducing the particles into the current expansion layer in a targeted manner.

The transparent material may include a transparent conductive oxide (TCO).

ITO is particularly suitable as a transparent conductive oxide. Advantageously, it is possible for ITO to be applied on to a radiation side of the semiconductor body together with particles of a further material and form the current expansion layer as a material composite. The current expansion layer can connect via an electrical contact due to the electrical conductivity of the ITO.

The current expansion layer may have an average refractive index $n2$ of equal or greater than 2.

To increase the outcoupling of light out the semiconductor body, it has been proved to be advantageous for the average refractive index $n2$ of the current expansion layer to be higher than two to reduce total reflection of light in the transition between semiconductor body and current expansion layer. Since transparent conductive oxides, in particular ITO, have a refractive index of less than two, the average refractive index $n2$ of the current expansion layer can advantageously be increased above the value of two through the particles of the further material.

The electrical contact may be at least partially formed as a contact web.

For example, the electrical contact includes a terminal, on which contacting is effected by a bond wire or further components, for example. Furthermore, the contact advantageously extends as a contact web over a radiation side of the current expansion layer and has a small width in relation to the width of the current expansion layer, for example, at most 10% of the width of the current expansion layer. This achieves a contacting of the current expansion layer, and shading effects due to the contact can be minimized. Advantageously, the contact web has a width of less than 20%, advantageously less than 10% or of less than 5% of the width of the current expansion layer.

A further layer may be arranged between the current expansion layer and the semiconductor body, this layer including a transparent conductive material and being free of particles of the further material.

The further layer advantageously includes a transparent conductive oxide. Nevertheless, the further layer advantageously does not include any particles of the further material. Advantageously, the further layer has a refractive index $n4$, which is, e.g., equal to the refractive index $n1$ of the transparent conductive material of the current expansion layer and less than the average refractive index $n2$ of the current expansion layer. Advantageously, such a layer allows minimizing the electric resistance below the current expansion layer and impressing the current into the semiconductor body from the current expansion layer advantageously in a good manner. Despite the fact that the improved outcoupling of light from the semiconductor body is lessened by the current expansion layer, the outcoupling can nevertheless be increased compared to a conventional current expansion layer if the thickness of the further layer does not exceed a critical value. Advantageously, the further layer has a thickness of less than or equal to 30 nm. In this way, a simultaneous reduction of the electric resistance and an optimization of the outcoupling of light is achieved through the further layer.

The semiconductor component may include a sapphire substrate.

The light-emitting semiconductor body can advantageously include a semiconductor layer sequence applied on to a sapphire substrate.

In a method of producing an optoelectronic semiconductor component, a light-emitting semiconductor body is provided. Furthermore, a current expansion layer is produced by simultaneously applying an electrically conductive material transparent to light radiated by the semiconductor body, and particles of a further material, on to a radiation side of the semiconductor body, wherein the current expansion layer at least partially covers the radiation side of the semiconductor body. Furthermore, an electrical contact is arranged on the current expansion layer.

Different materials can be applied on to the light-emitting semiconductor body, which is advantageously formed as a surface-emitting semiconductor chip, by deposition processes such that these materials advantageously form a firm material composite as a current expansion layer after the application. The contents of the materials to be applied can be adjusted to a specification during the application process and the materials can advantageously homogenously be distributed over the radiation side of the semiconductor body. Furthermore, it is also possible to apply a sequence of layers with varied contents of the materials on to the semiconductor body. In this way, a further layer, which advantageously includes an electrically-conductive transparent material but no particles of a further material, can be arranged between the semiconductor body and the current expansion layer, which includes the particles of the further material.

To increase an average refractive index of the current expansion layer, the content of the particles of a further material can be increased.

Production of the current expansion layer may be effected by simultaneously sputtering the transparent material and the particles of the further material.

Sputtering is advantageously suitable to apply materials such as transparent conductive oxides as well as particles made of, e.g., $TiO_2$ on to a radiation surface of the semiconductor body, in particular simultaneously, and to control the content of the respective materials on the radiation surface in the process. Furthermore, sputtering is also suitable to distribute the materials as homogenously as possible over the radiation surface during application on to the radiation surface, and advantageously form different materials as a material composite. Alternatively, the transparent conductive material and the particles of the further material can be applied by vaporization.

In the production of the current expansion layer, content of the transparent material and content of the particles of the further material are adjusted to a predetermined value to set an average refractive index $n2$ of the current expansion layer.

Advantageously, the particles of the further material have a higher refractive index $n3$ than the transparent conductive material. To achieve, e.g., an improved outcoupling out of the semiconductor body, the average refractive index $n2$ of the current expansion layer is increased by the content of particles of the further material upon application of the transparent material and of the particles. Depending on the desired outcoupling amount, the content of the particles or the content of the transparent material in the material composite of the current expansion layer can be adjusted such that a predetermined average refractive index $n2$ of the current expansion layer is achieved. Furthermore, it is also possible that the contents of the particles and the transparent material are changed during the application, and that the contents and the average refractive index $n2$ of the current expansion layer within the completed current expansion layer vary depending on the distance to the radiation surface of the semiconductor body.

Further advantages, advantageous developments result from the example described in the following in conjunction with the figures.

Like or similar elements are denoted with the same reference characters throughout the figures, respectively. The constituents as well as the size ratios illustrated in the figures are not to be considered as being true to scale.

FIG. 1a shows a schematic side view an optoelectronic semiconductor component 10 with a light-emitting semiconductor body 1 having a radiation side 1a, on which a current expansion layer 2 is arranged and partially covers the radiation side 1a. Advantageously, through the current expansion layer 2, current is fed into the semiconductor body 1 from an electrical contact 3 arranged on the side of the current expansion layer 2 facing away from the semiconductor body 1, wherein the current is advantageously fed into the semiconductor body through the entire contact surface between the current expansion layer 2 and the radiation side 1a of the semiconductor body 1. To minimize a shading of the radiated light, the electrical contact 3 is arranged on subregion on the current expansion layer 2 that is as small as possible.

FIG. 1a further shows that the current expansion layer 2 includes an electrically-conductive material 2a transparent to the light radiated by the semiconductor body 1, as well as particles 2b of a further material, wherein the transparent electrically-conductive material 2a includes ITO, for example, and the particles 2b includes $TiO_2$, for example. The particles 2b and the transparent, electrically-conductive material 2a form the current expansion layer as a firm material composite here, and the particles 2b are distributed in the current expansion layer 2 advantageously in a homogenous manner.

The particles 2b have a refractive index $n3$, which is advantageously higher than a refractive index $n1$ of the transparent material. Depending on the content of particles 2b in the current expansion layer 2, a refractive index $n2$ resulting in the material composite of the current expansion layer 2 is increased by the value $n1$ of the refractive index of the transparent material 2a. This causes a change of the transmission properties of the current expansion layer 2 for light compared to a current expansion layer 2 without particles 2b, which changes the angular condition for total reflection of light at the interface of the current expansion layer and the semiconductor body. A reduced total reflection of light at the interface of the semiconductor body and the current expansion layer 2 increases the outcoupling efficiency out of the semiconductor body.

FIG. 1b shows an optoelectronic semiconductor component 10, which is similar to that of FIG. 1a, except that the current expansion layer 2, on the radiation side 1a of the semiconductor body 1, includes a further layer 9, which includes a transparent conductive material 2a and is free of particles of the further material.

The further layer 9 has a refractive index $n4$, which is, e.g., equal to the refractive index $n1$ of the transparent conductive material of the current expansion layer 2, and less than the average refractive index $n2$ of the current expansion layer that has the particles of the further material. The further layer 9 advantageously has a thickness D of less than or equal to 30 nm. However, the thickness D of the further layer 9 advantageously must be at least 10 nm. As a result, the further layer 9 is thin enough so that it acts on the photons from the semiconductor body advantageously not only in an optical manner, and that a wave function of the photons at the interface of the semiconductor body with the further layer and the current expansion layer 2 interacts with the particles 2b. This achieves a simultaneous reduction of the electrical resistance for the current impression into the semiconductor body 1 and an optimized outcoupling of light through the further layer 9. The further layer 9 can be formed as a distinct layer.

FIG. 2a shows an optoelectronic semiconductor component 10 in a top view, wherein an electrical contact 3 is arranged on a current expansion layer 2. A terminal S is arranged on the current expansion layer 2, on which contacting is effected by bond wire, for example. The current expansion layer 2 includes a contact web K, which advantageously has a width of less than 20%, advantageously less than 10% or less than 5% of the width of the current expansion layer 2.

The configuration of the contact web, which is relatively small compared to the current expansion layer 2, minimizes the shading effects by the contact 3.

FIG. 2b shows the electrical contact 3 on the current expansion layer 2 of FIG. 2a a schematic sectional view along a line A of FIG. 2a. The semiconductor body 1 can include a sapphire substrate, for example.

FIG. 2c shows an optoelectronic semiconductor component 10 in a top view, wherein the semiconductor body does not have a terminal for an external contacting on the current expansion layer 2, but in which multiple contact webs K are guided on to the radiation side of the current expansion layer 2 from a frame region 3a, which laterally surrounds the semiconductor body and the current expansion layer 2. This configuration is particularly suitable for semiconductor chips without substrate.

Figure 3:
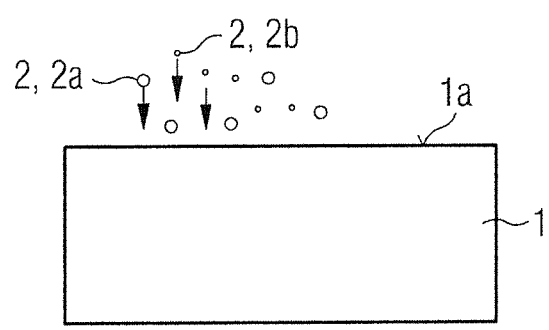
FIG. 3 shows production of a current expansion layer on a semiconductor body.

FIG. 3 shows the semiconductor body 1 in a schematic side view during the production of the current expansion layer 2, wherein an electrically conductive material 2a, which is transparent to the light radiated by the semiconductor body and particles 2b of a further material are applied on a radiation side 1a of a semiconductor body 1, e.g., by sputtering, and form the current expansion layer 2 as a material composite. Depending on the specification, the contents of the transparent conductive material 2a and of the particles 2b of a further material can be varied accordingly.

Our components and methods are not limited to the examples by the description of these examples. This disclosure rather comprises any new feature as well as any combination of features, which in particular includes any combination of features in the appended claims, even if the feature or combination is per se not explicitly stated in the claims or examples.

This application claims priority of DE 10 2015 111 573.5, the subject matter of which is incorporated herein by reference.

The invention claimed is:

1. An optoelectronic semiconductor component comprising:
   a light-emitting semiconductor body having a radiation side,
   a current expansion layer arranged on the radiation side of the semiconductor body and at least partially covers the radiation side, wherein the current expansion layer includes a transparent material that is electrically conductive and transparent to the light radiated by the semiconductor body and particles of a further material, and the particles of the further material are distributed homogenously within the current expansion layer, and
   an electrical contact arranged on a side of the current expansion layer facing away from the semiconductor body.

2. The optoelectronic semiconductor component according to claim 1, wherein the particles of the further material have a refractive index n3, which is different from a refractive index n1 of the transparent material.

3. The optoelectronic semiconductor component according to claim 1, wherein the refractive index n3 of the particles of the further material is higher than the refractive index n1 of the transparent material.

4. The optoelectronic semiconductor component according to claim 1, wherein the particles of the further material include $TiO_2$.

5. The optoelectronic semiconductor component according to claim 1, wherein the transparent material includes a transparent conductive oxide.

6. The optoelectronic semiconductor component according to claim 1, wherein the current expansion layer has an average refractive index n2 of equal to or higher than 2.

7. The optoelectronic semiconductor component according to claim 1, wherein the electrical contact is at least in part formed as a contact web.

8. The optoelectronic semiconductor component according to claim 1, wherein a further layer is arranged between the current expansion layer and the semiconductor body, which includes a further transparent conductive material and is free of the particles of the further material.

9. The optoelectronic semiconductor component according to claim 1, wherein the semiconductor component includes a sapphire substrate.

10. A method of producing an optoelectronic semiconductor component comprising:
    providing a light-emitting semiconductor body,
    producing a current expansion layer by simultaneously applying an electrically-conductive material transparent to light radiated by the semiconductor body and particles of a further material, on a radiation side of the semiconductor body, wherein the current expansion layer at least partially covers the radiation side of the semiconductor body and the particles of the further material are homogenously distributed within the current expansion layer, and
    arranging an electrical contact on the current expansion layer.

11. The method according to claim 10, wherein production of the current expansion layer is effected by simultaneous sputtering of the transparent material and the particles of the further material.

12. The method according to claim 10, wherein content of the transparent material and content of the particles of the further material are adjusted to a predetermined value to set an average refractive index n2 of the current expansion layer.

13. An optoelectronic semiconductor component comprising:
    a light-emitting semiconductor body having a radiation side,
    a current expansion layer arranged on the radiation side of the semiconductor body and at least partially covers the radiation side, wherein the current expansion layer includes a transparent material that is electrically conductive and transparent to the light radiated by the semiconductor body and particles of a further material, and the particles of the further material are homogenously distributed within the current expansion layer, and
    an electrical contact arranged on a side of the current expansion layer facing away from the semiconductor body, wherein
    the transparent electrically-conductive material and the particles of the further material form a material composite,
    the refractive index n3 of the particles of the further material is higher than the refractive index n1 of the transparent material, and
    the particles of the further material include $TiO_2$.

* * * * *